(12) United States Patent
Iwamoto (10) Patent No.: US 10,305,444 B2
(45) Date of Patent: *May 28, 2019

(54) ELECTRONIC COMPONENT MODULE (71) Applicant: Murata Manufacturing Co., Ltd., Nagaokakyo-shi, Kyoto-fu (JP)

(72) Inventor: Takashi Iwamoto, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 272 days.

This patent is subject to a terminal disclaimer.

(21) Appl. No.: 15/185,294

(22) Filed: Jun. 17, 2016

(65) Prior Publication Data

US 2016/0301382 A1 Oct. 13, 2016

Related U.S. Application Data

(63) Continuation of application No. PCT/JP2014/083826, filed on Dec. 22, 2014.

(30) Foreign Application Priority Data

Dec. 25, 2013 (JP) .................. 2013-267367

(51) Int. Cl.
*H03H 9/00* (2006.01)
*H03H 9/05* (2006.01)
(Continued)

(52) U.S. Cl.
CPC ....... *H03H 9/0566* (2013.01); *H01L 41/0475* (2013.01); *H01L 41/053* (2013.01);
(Continued)

(58) Field of Classification Search
CPC .. H03H 9/0523; H03H 9/0538; H03H 9/0547; H03H 9/0552; H03H 9/0566;
(Continued)

(56) References Cited

U.S. PATENT DOCUMENTS 5,337,026 A * 8/1994 Borchelt ............ H03H 9/02929
310/313 R
5,438,305 A * 8/1995 Hikita ...................... H01L 23/66
174/551

(Continued)

FOREIGN PATENT DOCUMENTS

JP 2003-249868 A 9/2003
JP 2006-186747 A 7/2006
(Continued)

OTHER PUBLICATIONS

Official Communication issued in International Application PCT/JP2014/083826, dated Mar. 31, 2015.

*Primary Examiner* — Barbara Summons
(74) *Attorney, Agent, or Firm* — Keating & Bennett, LLP (57) ABSTRACT

A front-end circuit component includes a base-body elastic wave filter and a mounted electronic component. The base-body elastic wave filter includes a piezoelectric substrate and an IDT electrode on an upper surface of a piezoelectric substrate. The mounted electronic component is mounted above the piezoelectric substrate to define a sealed space in which the IDT electrode is disposed.

16 Claims, 7 Drawing Sheets

(51) Int. Cl.

| | | |
|---|---|---|
| *H03H 9/10* | (2006.01) | |
| *H03H 9/54* | (2006.01) | |
| *H03H 9/64* | (2006.01) | |
| *H03H 9/72* | (2006.01) | |
| *H04B 1/00* | (2006.01) | |
| *H04L 5/14* | (2006.01) | |
| *H01L 41/047* | (2006.01) | |
| *H01L 41/053* | (2006.01) | |
| *H01L 41/311* | (2013.01) | |

(52) U.S. Cl.
CPC ......... *H01L 41/311* (2013.01); *H03H 9/0547* (2013.01); *H03H 9/0552* (2013.01); *H03H 9/1085* (2013.01); *H03H 9/542* (2013.01); *H03H 9/64* (2013.01); *H03H 9/725* (2013.01); *H04B 1/006* (2013.01); *H04B 1/0057* (2013.01); *H04L 5/1461* (2013.01); *H03H 2009/0019* (2013.01)

(58) Field of Classification Search
CPC .... H03H 9/0571; H03H 9/0576; H03H 9/058; H03H 9/105; H03H 9/1071; H03H 9/1085; H03H 9/1092; H03H 9/542; H03H 9/545; H03H 9/64; H03H 9/706; H03H 9/725; H03H 2009/0019; H01L 41/0475; H01L 41/053; H01L 41/311; H04B 1/0057; H04B 1/006; H04L 5/1461
USPC .................. 333/133, 193; 310/313 B, 313 D
See application file for complete search history.

(56) References Cited

U.S. PATENT DOCUMENTS

| | | | | |
|---|---|---|---|---|
| 7,151,424 | B2* | 12/2006 | Kando | H03H 9/0222 333/193 |
| 7,311,242 | B2* | 12/2007 | Six | H01L 23/20 228/180.22 |
| 7,999,632 | B2 | 8/2011 | Iwamoto | |
| 8,143,082 | B2* | 3/2012 | Dungan | B81C 1/0023 257/E21.305 |
| 8,228,127 | B2* | 7/2012 | Rebel | H03B 5/32 331/16 |
| 2004/0157367 | A1* | 8/2004 | Wong | H01L 21/50 438/106 |
| 2004/0201090 | A1* | 10/2004 | Aigner | H03H 9/0547 257/686 |
| 2005/0093171 | A1* | 5/2005 | Sugiura | H03H 9/0547 257/778 |
| 2006/0012021 | A1* | 1/2006 | Larson, III | H03B 5/326 257/686 |
| 2007/0013458 | A1 | 1/2007 | Itou et al. | |
| 2007/0107177 | A1* | 5/2007 | Kawachi | H03H 3/08 29/25.35 |
| 2009/0224851 | A1* | 9/2009 | Feiertag | H03H 9/059 333/186 |
| 2009/0289722 | A1* | 11/2009 | Dropmann | H01L 23/66 330/303 |
| 2010/0045145 | A1 | 2/2010 | Tsuda | |
| 2011/0006381 | A1* | 1/2011 | Feiertag | B81B 7/007 257/416 |
| 2011/0043078 | A1 | 2/2011 | Tsuda | |
| 2011/0221546 | A1 | 9/2011 | Yamaji et al. | |
| 2012/0049978 | A1* | 3/2012 | Pang | H03H 9/0547 333/189 |
| 2014/0003196 | A1 | 1/2014 | Tajima | |
| 2014/0354374 | A1 | 12/2014 | Kawachi et al. | |

FOREIGN PATENT DOCUMENTS

| | | |
|---|---|---|
| JP | 2006-337135 A | 12/2006 |
| JP | 2007-27949 A | 2/2007 |
| JP | 2008-546207 A | 12/2008 |
| JP | 2010-50539 A | 3/2010 |
| JP | 2010-136143 A | 6/2010 |
| JP | 2011-147098 A | 7/2011 |
| JP | 2011-160021 A | 8/2011 |
| JP | 2011-188255 A | 9/2011 |
| JP | 2011-211347 A | 10/2011 |
| JP | 5358724 B1 | 12/2013 |
| WO | 2013/128541 A1 | 9/2013 |

* cited by examiner

ELECTRONIC COMPONENT MODULE

CROSS REFERENCE TO RELATED APPLICATIONS

This application claims the benefit of priority to Japanese Patent Application 2013-267367 filed Dec. 25, 2013 and is a Continuation application of PCT/JP2014/083826 filed on Dec. 22, 2014. The entire content of each application are hereby incorporated by reference.

BACKGROUND OF THE INVENTION

1. Field of the Invention

The present invention relates to an electronic component module supporting a plurality of frequency bands.

2. Description of the Related Art

An example of an electronic component module of a front end incorporated in a mobile terminal such as a wireless communication device includes a front-end module described in Japanese Unexamined Patent Application Publication No. 2003-249868. The front-end module includes as chip components a diplexer, a low pass filter, and the like, and the chip components are mounted on a resin multilayer substrate. Active elements included in switches are also mounted on the resin multilayer substrate, and passive elements included in the switches are laminated as inner layers of the resin multilayer substrate.

In the front-end module described in Japanese Unexamined Patent Application Publication No. 2003-249868, the chip components and the like are two dimensionally mounted on the surface of the resin multilayer substrate. This may cause an increase in size of the front-end module.

SUMMARY OF THE INVENTION

Preferred embodiments of the present invention provide an electronic component module that is able to be downsized.

An electronic component module according to a preferred embodiment of the present invention includes an elastic wave filter and a mounted electronic component. The elastic wave filter includes a piezoelectric substrate and a functional electrode provided on the piezoelectric substrate. The mounted electronic component is mounted above the piezoelectric substrate such that a space in which the functional electrode is disposed is provided.

With this configuration, the mounted electronic component is mounted above the elastic wave filter, and the electronic component module is thus able to be downsized.

An electronic component module according to a preferred embodiment of the present invention preferably includes a cover layer. The cover layer is spaced away from and faces the upper surface of the piezoelectric substrate and covers the functional electrode. The mounted electronic component is mounted on an upper surface of the cover layer.

This structure eliminates the need for separately providing an interposer and a printed circuit board as rewiring layers and thus enables height and cost reduction of an electronic component module.

An electronic component module according to a preferred embodiment of the present invention preferably includes a cover layer that is flexible and the elastic wave filter includes a wiring layer provided on the upper surface of the cover layer. The mounted electronic component is connected to the wiring layer.

The wiring layer is used for not only electrical connection but also reinforcement of the cover layer. Accordingly, the cover layer does not easily bend, and the mounted electronic component can be mounted on the upper surface of the cover layer without collapsing the sealed space above the functional electrode.

In addition, patterning is able to performed finely and with high accuracy on the wiring layer by a photolithography method. Accordingly, the mounted electronic component is able to be mounted with high density, and the electronic component module is able to be further downsized.

In addition, even though a thermal stress is applied to the electronic component module, the thermal stress is not concentrated on a connection portion between the mounted electronic component and the wiring layer. Accordingly, the connection portion between the mounted electronic component and the wiring layer is not easily damaged, and high connection reliability is thus ensured.

The cover layer is preferably made of a resin film material.

An electronic component module according to a preferred embodiment of the present invention preferably includes a signal extraction wire line that is provided above the piezoelectric substrate and extends upwards. An area where the mounted electronic component is mounted is smaller than an area of the upper surface of the piezoelectric substrate. The signal extraction wire line is disposed outward from the mounted electronic component and is disposed inward of the upper surface of the piezoelectric substrate when viewed in a direction perpendicular to the piezoelectric substrate.

This structure enables the electronic component module to be downsized further.

An electronic component module according to a preferred embodiment of the present invention preferably includes a plurality of the elastic wave filters respectively having different pass bands. The mounted electronic component preferably includes a radio frequency switch.

The plurality of the elastic wave filters respectively having different pass bands preferably respectively include a plurality of chips.

At least one of the plurality of chips is preferably a chip having a function other than a function of the elastic wave filters, the chip including a semiconductor device.

The elastic wave filter is a first elastic wave filter, and the mounted electronic component preferably includes a second elastic wave filter.

This structure enables the electronic component module to support a frequency band that is not supported by the first elastic wave filter.

An electronic component module according to a preferred embodiment of the present invention preferably includes a plurality of radio frequency filters each of which includes the elastic wave filter or the mounted electronic component. The mounted electronic component includes a radio frequency switch. The radio frequency switch is connected to the radio frequency filters with the wiring layer interposed between the radio frequency switch and each of the radio frequency filters.

This structure configuration enables reduction of a line length between the radio frequency switch and the radio frequency filter, and favorable device characteristics are thus obtained. In addition, the number of external terminals of the electronic component module is able to be reduced.

The radio frequency switch preferably includes a plurality of terminals and a common terminal that is connected to any one of the terminals. The common terminal is connected to an antenna, and each of the terminals is connected to a corresponding one of the radio frequency filters with the wiring layer interposed between the terminal and the radio frequency filter.

An electronic component module according to a preferred embodiment of the present invention preferably a multilayer substrate on which at least one of a capacitor and an inductor is provided.

According to various preferred embodiments of the present invention, an electronic component module is able to be downsized.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

An electronic component module according to a first preferred embodiment of the present invention will be described. The description is provided by using a front-end circuit component as the electronic component module. The front-end circuit component 10 is connected to an antenna and transmission and reception devices and demultiplexes transmission and reception signals in accordance with a used frequency band. The front-end circuit component 10 is preferably used for a wireless communication device operating, for example, in a multiband and a multimode.

Figure 1:
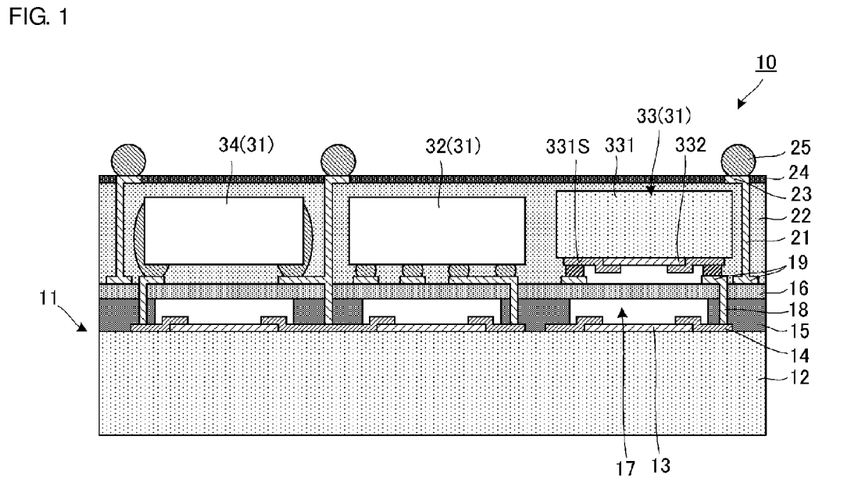
FIG. 1 is a schematic cross-sectional diagram of a front-end circuit component according to a first preferred embodiment of the present invention.

FIG. 1 is a schematic cross-sectional diagram of the front-end circuit component 10. The front-end circuit component includes a base-body elastic wave filter 11, a RF (Radio Frequency) switch 32, an elastic wave filter 33, and a chip inductor 34. The RF switch 32 corresponds to a radio frequency switch of a preferred embodiment of the present invention. The elastic wave filter 33 corresponds to a second elastic wave filter of a preferred embodiment of the present invention.

The base-body elastic wave filter 11 and the elastic wave filter 33 are surface acoustic wave filters, for example, but may be boundary acoustic wave filters, bulk acoustic wave filters, plate wave filters, or the like. The RF switch 32, the elastic wave filter 33, and the chip inductor 34 are examples of mounted electronic components 31. The mounted electronic components 31 may also be, for example, a chip inductor, a chip capacitor, a LC filter, and the like.

One of the mounted electronic components 31 may be a multilayer substrate such as a LTCC (Low Temperature Co-fired Ceramics) substrate or a printed circuit board in which a capacitance component and an inductance component are patterned. In this way, the front-end circuit component 10 achieves a higher degree of integration than in a case where a chip inductor and a chip capacitor are mounted.

The base-body elastic wave filter 11 includes a piezoelectric substrate 12, IDT (Interdigital Transducer) electrodes 13, a first wiring layer 14, a supporting layer 15, a cover layer 16, extended wiring lines 18, and a second wiring layer 19. Each of the IDT electrodes 13 corresponds to a functional electrode of a preferred embodiment of the present invention. The second wiring layer 19 corresponds to a "wiring layer" of a preferred embodiment of the present invention. Each IDT electrode 13, the first wiring layer 14, the supporting layer 15, and the cover layer 16 are stacked on the piezoelectric substrate 12 in this order. Patterning is performed on the IDT electrodes 13 in such a manner that resonators having a plurality of pass bands are formed. The first wiring layer 14 is connected to each IDT electrode 13. A $SiO_2$ protection film (not illustrated) is formed on surfaces (upper surfaces) of the IDT electrode 13 and the first wiring layer 14 in such a manner that portions in contact with the extended wiring lines 18 are exposed.

The supporting layer 15 preferably surrounds the IDT electrode 13. The cover layer 16 preferably extends above the IDT electrodes 13. In this way, sealed spaces (IDT spaces) 17 are provided above the IDT electrodes 13. Note that the supporting layer 15 and the cover layer 16 are formed separately but may be formed integrally.

Vias are provided in the supporting layer 15 and the cover layer 16, and each extended wiring line 18 is provided in a corresponding one of the vias. The extended wiring line 18 is connected to the first wiring layer 14. The second wiring layer 19 is provided on an upper surface of the cover layer 16. The second wiring layer 19 is connected to each extended wiring line 18. Note that the second wiring layer 19 includes wiring lines and mounting pads. A $SiO_2$ protection film (not illustrated) is provided on the surface of the second wiring layer 19 such that portions corresponding to the mounting pads and portions in contact with extended wiring lines 21 are exposed.

As described above, the base-body elastic wave filter 11 includes the plurality of elastic wave filters respectively having different pass bands and is able to support the plurality of frequency bands. Each elastic wave filter included in the base-body elastic wave filter 11 corresponds to an "elastic wave filter" of a preferred embodiment of the present invention.

The RF switch 32, the elastic wave filter 33, and the chip inductor 34 are mounted on the mounting pads of the second wiring layer 19. The elastic wave filter 33 includes a piezoelectric substrate 331 and an IDT electrode 332 provided on a main surface 331S of the piezoelectric substrate 331. The elastic wave filter 33 is mounted on one of the mounting pads of the second wiring layer 19 such that the main surface 331S of the piezoelectric substrate 331 faces an upper surface of the cover layer 16. The mounting of the elastic wave filter 33 enables the front-end circuit component 10 to support a frequency band that is not supported by the base-body elastic wave filter 11. An area where the mounted electronic components 31 are mounted is smaller than the area of an upper surface of the piezoelectric substrate 12. The base-body elastic wave filter 11 is connected to the mounted electronic components 31 with only the extended wiring lines 18 and the second wiring layer 19 interposed therebetween.

Each columnar extended wiring line 21 is provided on an upper surface of the second wiring layer 19. The extended wiring line 21 corresponds to a signal extraction wire line of a preferred embodiment of the present invention. The extended wiring line 21 is connected to the second wiring layer 19. The extended wiring line 21 extends outward from a corresponding one of the mounted electronic components 31. The extended wiring line 21 is disposed inward of the piezoelectric substrate 12 when viewed in a stacking direction. As described above, the front-end circuit component 10 is able to be downsized compared with a case where the extended wiring line 21 is disposed outward from the piezoelectric substrate 12 when viewed in the stacking direction.

A resin layer 22 covers the mounted electronic components 31, the second wiring layer 19, and the extended wiring line 21. In addition, the resin layer 22 preferably surrounds the IDT electrode 332 of the elastic wave filter 33. In this way, a sealed space is provided between a lower surface of the elastic wave filter 33 and the upper surface of the cover layer 16. An upper end portion of the extended wiring line 21 is exposed from the resin layer 22.

Offset wiring lines 23 are provided on an upper surface of the resin layer 22. Each offset wiring line 23 is connected to the upper end portion of a corresponding one of the extended wiring lines 21. A protection layer 24 is provided on the upper surface of the resin layer 22 such that each offset wiring line 23 is exposed. Mounting terminals 25 are provided on an upper surface of the offset wiring lines 23. The protection layer 24 prevents solder of each mounting terminal 25 from spreading.

The piezoelectric substrate 12 is preferably a LiTaO$_3$ substrate or the like. Each IDT electrode 13 and the first wiring layer 14 are made of a metal material such as Al, Cu, Pt, Au, W, Ta, or Mo, or an alloy of one of these as a main component and may also have a laminated structure. The supporting layer 15 and the resin layer 22 are made of a resin such as polyimide or an epoxy resin. The cover layer 16 is made of a resin film material that is flexible, such as a polyimide film. The extended wiring lines 18 and 21, the second wiring layer 19, and the offset wiring line 23 are made of a metal film such as an Au/Ni/Cu film. As described above, the mounting terminal 25 is made of solder.

The cover layer 16 is made of a thin resin film and provided to define the sealed spaces 17. Accordingly, if mounting of one of the mounted electronic components 31 on the upper surface of the cover layer 16 is attempted, the cover layer 16 may bend, and a corresponding one of the sealed spaces 17 may collapse. However, the second wiring layer 19 is provided on the upper surface of the cover layer 16 in the first preferred embodiment, and the cover layer 16 thus does not easily bend. In other words, the second wiring layer 19 is used for not only electrical connection but also reinforcement of the cover layer 16. Accordingly, the mounted electronic component 31 is able to be mounted on the upper surface of the cover layer 16 without collapsing the sealed space 17. The configuration as described above enables downsizing compared with the case where mounted electronic components such as RF switches and elastic wave filters are two dimensionally arranged on a circuit board such as a LTCC substrate or a printed circuit board.

In addition, a wiring layer provided on the circuit board is generally patterned by using screen printing. In contrast, the second wiring layer 19 is patterned by using a photolithography method as will be described later. Accordingly, patterning is able to be performed on the second wiring layer 19 more finely and with higher accuracy than on the wiring layer formed on the circuit board. As a result, the degree of wiring integration is improved, and the mounted electronic components are able to be mounted with higher density than in the configuration in which the mounted electronic components are two dimensionally arranged on the circuit board. Accordingly, further downsizing is possible.

In addition, as described above, the mounted electronic components 31 are mounted on the upper surface of the cover layer 16. Thus, this structure eliminates the need for separately providing an interposer and a printed circuit board as rewiring layers for the base-body elastic wave filter 11 and the mounted electronic components 31, thus enabling height and cost reduction.

In addition, as described above, the cover layer 16 is made of the flexible resin film. Accordingly, even though a thermal stress is applied to the front-end circuit component 10, the thermal stress is not concentrated on connection portions between the second wiring layer 19 and the mounted electronic components 31. As a result, the connection portions between the second wiring layer 19 and the mounted electronic components 31 are not easily damaged, and high connection reliability is thus ensured.

Figure 2:
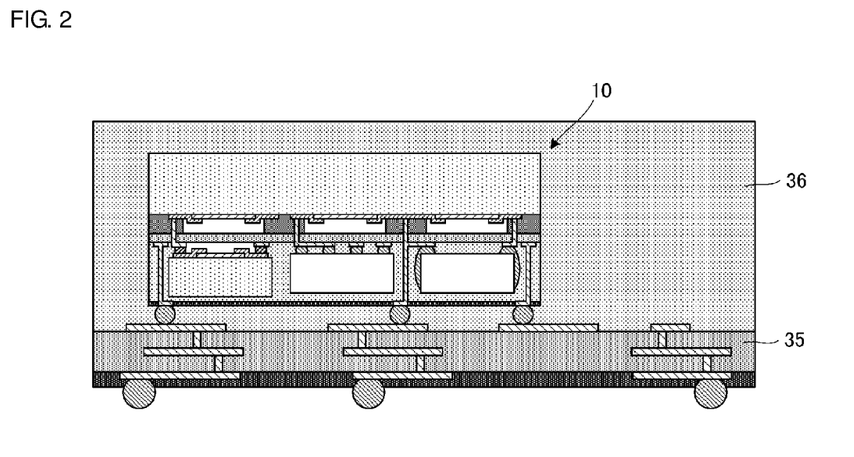
FIG. 2 is a schematic cross-sectional diagram illustrating the front-end circuit component according to the first preferred embodiment of the present invention that has been mounted.

FIG. 2 is a schematic cross-sectional diagram illustrating the front-end circuit component 10 that has been mounted. A module substrate 35 is formed preferably by laminating base material layers each having a conductor pattern formed therein. The module substrate 35 includes a capacitance component and an inductance component formed therein. Mounting pads are formed on an upper surface of the module substrate 35, and mounting terminals are formed on a lower surface of the module substrate 35. The front-end circuit component 10 is mounted on the mounting pads of the module substrate 35. A resin layer 36 is formed so as to cover the front-end circuit component 10.

As described above, the second wiring layer 19 of the cover layer 16 of the front-end circuit component 10 has a higher accuracy than wiring of the module substrate 35, and the degree of wiring integration is thus improved. Accordingly, the entire module including the module substrate 35 is able to be downsized.

As described above, the mounted electronic components 31 may also include the multilayer substrate having the capacitance component and the inductance component patterned thereon. The module substrate 35 and the resin layer 36 can thus be omitted.

Figure 3:
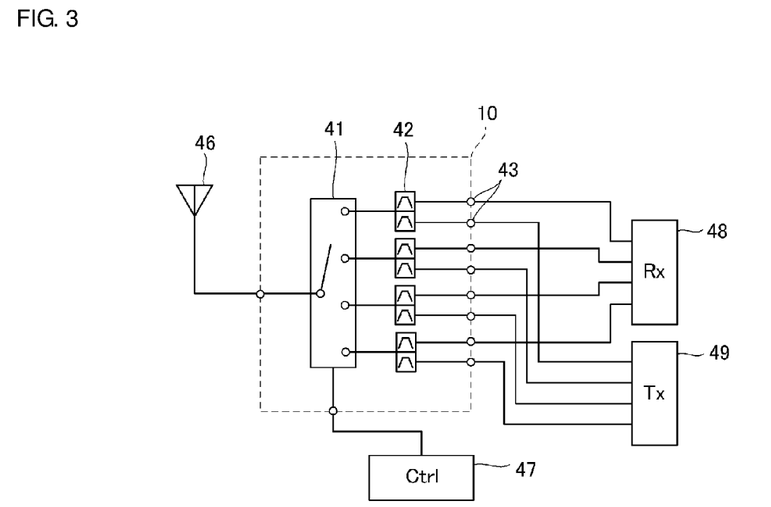
FIG. 3 is a circuit diagram of a first example of the front-end circuit component according to the first preferred embodiment of the present invention.

FIG. 3 is a circuit diagram of the front-end circuit component 10. The front-end circuit component 10 includes a RF switch 41, duplexers 42, and external terminals 43. The RF switch 41 includes a plurality of terminals and a common terminal that is connected to any one of the terminals under the control of a switch controller 47. The common terminal of the RF switch 41 is connected to an antenna 46. Each terminal of the RF switch 41 is connected to a reception controller 48 and a transmission controller 49 with a corresponding one of the duplexers 42 interposed therebetween.

The RF switch 41 is implemented by the RF switch 32 that is one of the mounted electronic components 31 (see FIG. 1). The duplexers 42 are implemented by the base-body elastic wave filter 11 and the elastic wave filter 33. The external terminals 43 are implemented by the mounting terminals 25. Wiring between the RF switch 41 and each duplexer 42 is implemented by the extended wiring line 18 and the second wiring layer 19 only.

As described above, the RF switch 41 is connected to the duplexers 42 through only the wiring lines in the front-end circuit component 10 in the first preferred embodiment. Accordingly, the line length between the RF switch 41 and each duplexer 42 is reduced compared with the configuration in which the mounted electronic components are two dimensionally arranged on the circuit board, and favorable device characteristics are thus obtained. In addition, the number of the external terminals 43 of the front-end circuit component 10 is reduced compared with the case where the RF switch 41 is connected to the duplexers 42 by using wiring lines outside the front-end circuit component 10. Note that wiring between the RF switch 41 and each duplexer 42 may be implemented partially by wiring outside the front-end circuit component 10. Although the advantageous effects are reduced to some extent, similar advantageous effects are able to be realized also in this case.

Figure 4:
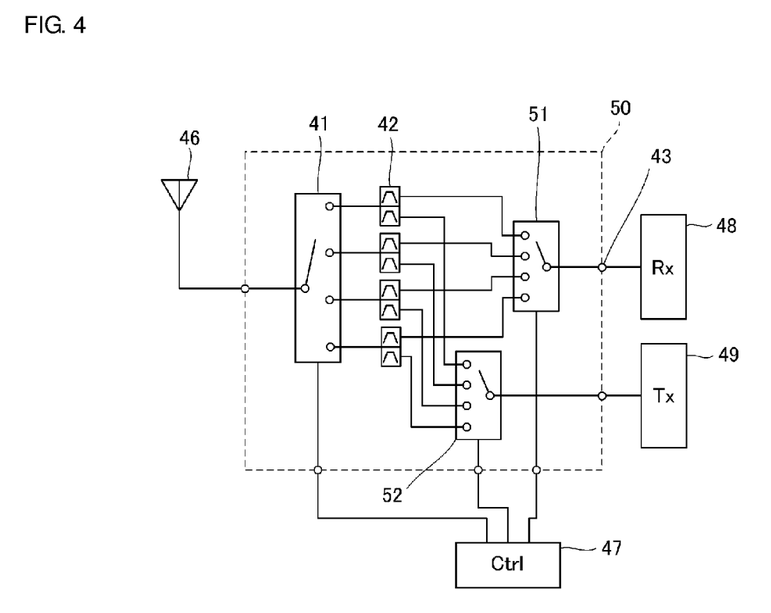
FIG. 4 is a circuit diagram of a second example of the front-end circuit component according to the first preferred embodiment of the present invention.

FIG. 4 is a circuit diagram of a front-end circuit component 50. The front-end circuit component 50 is a second example of the front-end circuit component 10 according to the first preferred embodiment of the present invention. The front-end circuit component 50 includes switches 51 and 52 in addition to the configuration of the front-end circuit component 10. The RF switches 51 and 52 each correspond to the radio frequency switch according to a preferred embodiment of the present invention.

The switches 51 and 52 each include a plurality of terminals and a common terminal connected to any one of the terminals under the control of the switch controller 47. The terminals of the switch 51 are connected to reception side terminals of the duplexers 42. The common terminal of the switch 51 is connected to the reception controller 48. The terminals of the switch 52 are connected to transmission side terminals of the duplexers 42. The common terminal of the switch 52 is connected to the transmission controller 49. The configuration of the front-end circuit component 50 other than the above configuration is the same as the configuration of the front-end circuit component 10.

In the front-end circuit component 50, the switch 51 exclusively has the reception side terminals of the duplexers 42, and the switch 52 exclusively has the transmission side terminals of the duplexers 42. In this way, the number of the external terminals 43 is reduced compared with the front-end circuit component 10. In addition, even if the number of frequency bands for the front-end circuit component 50 is increased, the number of the external terminals 43 is not increased.

Figure 5A:
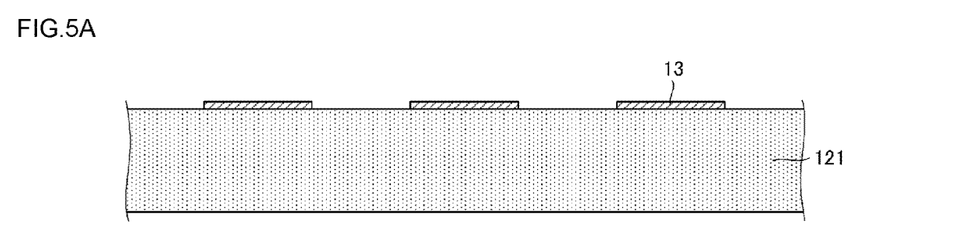
FIGS. 5A-5D are schematic cross-sectional diagrams illustrating a method for manufacturing the front-end circuit component according to the first preferred embodiment of the present invention.

FIGS. 5A to 8 are schematic cross-sectional diagrams illustrating a non-limiting example of a method for manufacturing the front-end circuit component 10. First, as illustrated in FIG. 5A, the IDT electrodes 13 are formed on an upper surface of a piezoelectric wafer 121 by the photolithography method or the like in such a manner that a resonator pattern having a plurality of pass bands is formed. At this time, the film thickness of each IDT electrode 13 is changed in accordance with a corresponding one of the pass bands.

Figure 5B:
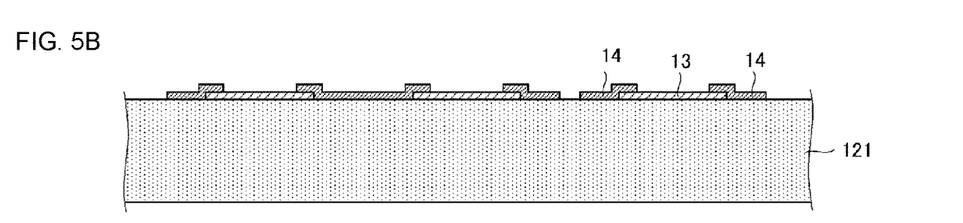

Subsequently, as illustrated in FIG. 5B, a plurality of metal films are laminated on the upper surface of the piezoelectric wafer 121, and the first wiring layer 14 is thus formed. The first wiring layer 14 is connected to each IDT electrode 13. The first wiring layer 14 is formed by the photolithography method or the like. Subsequently, a $SiO_2$ protection film (not illustrated) is formed on the surfaces of the IDT electrode 13 and the first wiring layer 14 by sputtering or the like. Cavities are formed in the $SiO_2$ protection film by dry etching to enable connection between the first wiring layer 14 and each extended wiring line 18 (see FIG. 6B).

Figure 5C:
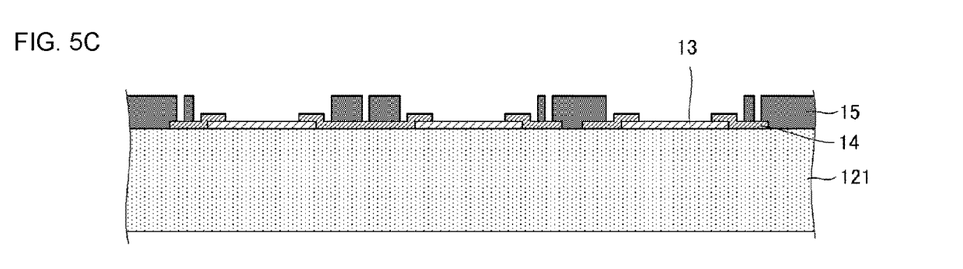

Subsequently, as illustrated in FIG. 5C, a photosensitive resin is applied to the upper surface of the piezoelectric wafer 121 by a spin coating method. Patterning is performed on the photosensitive resin by the photolithography method in such a manner that the IDT electrodes 13 are exposed and that cavities in positions corresponding to the extended wiring lines 18 are formed. In this way, the supporting layer 15 is formed.

Figure 5D:
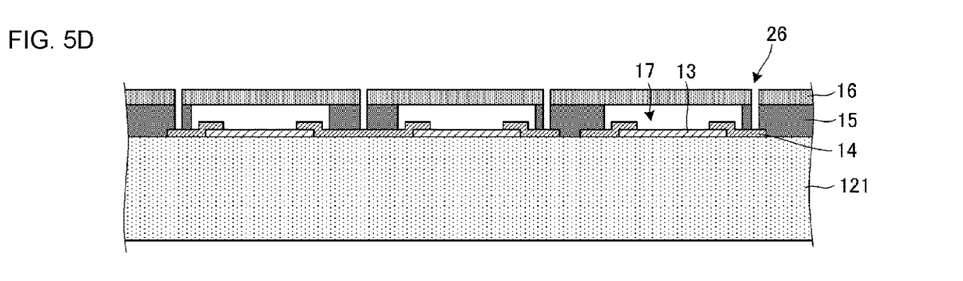

Subsequently, as illustrated in FIG. 5D, a photosensitive resin sheet is pasted on an upper surface of the supporting layer 15 by a roll lamination method or the like. Subsequently, patterning is performed on the photosensitive resin sheet by the photolithography method such that cavities in portions corresponding to the cavities of the supporting layer 15 are formed. In this way, the cover layer 16 and vias 26 are formed, and the sealed spaces 17 are also formed above the IDT electrodes 13, respectively.

Figure 6A:
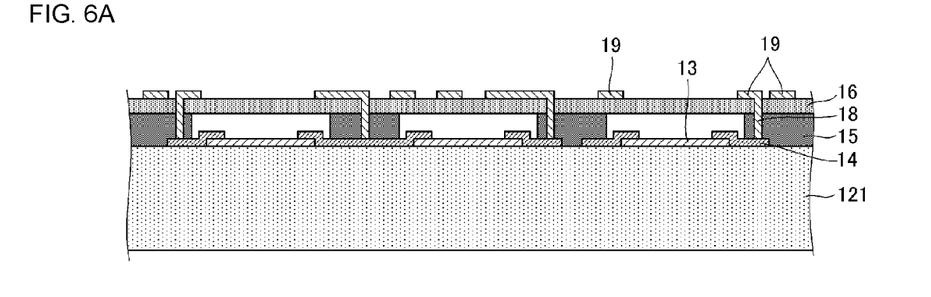
FIGS. 6A-6C are schematic cross-sectional diagrams illustrating a method for manufacturing the front-end circuit component according to the first preferred embodiment of the present invention.

Subsequently, as illustrated in FIG. 6A, by electrolytic plating, the extended wiring lines 18 are respectively formed in the vias 26, and the second wiring layer 19 is formed on the upper surface of the cover layer 16. Each extended wiring line 18 is connected to the first wiring layer 14 and the second wiring layer 19. Specifically, the extended wiring lines 18 and the second wiring layer 19 are formed in the following manner. First, a plated feed film formed of a Cu/Ti film is formed by sputtering. Subsequently, a resist having openings corresponding to portions to provide the extended wiring lines 18 and the second wiring layer 19 is formed by the photolithography method. Subsequently, an Au/Ni/Cu film is formed by the electrolytic plating. Subsequently, the resist is released, and the feed film is removed by etching. In this way, the extended wiring lines 18 and the second wiring layer 19 are formed.

Subsequently, a $SiO_2$ protection film (not illustrated) is formed on the surface of the second wiring layer 19 by sputtering or the like. Cavities are formed in the $SiO_2$ protection film by dry etching such that, on the upper surface of the second wiring layer 19, portions corresponding to the mounting pads and portions in contact with the extended wiring lines 21 (see FIG. 6(B)) are exposed.

In accordance with the steps described above, a plurality of structures each corresponding to the base-body elastic wave filter 11 (see FIG. 1) are formed on the piezoelectric wafer 121. Note that the IDT electrodes 13, the first wiring layer 14, and the like are preferably arranged so that the mounted electronic components 31 (see FIG. 6C) are efficiently mounted.

Figure 6B:
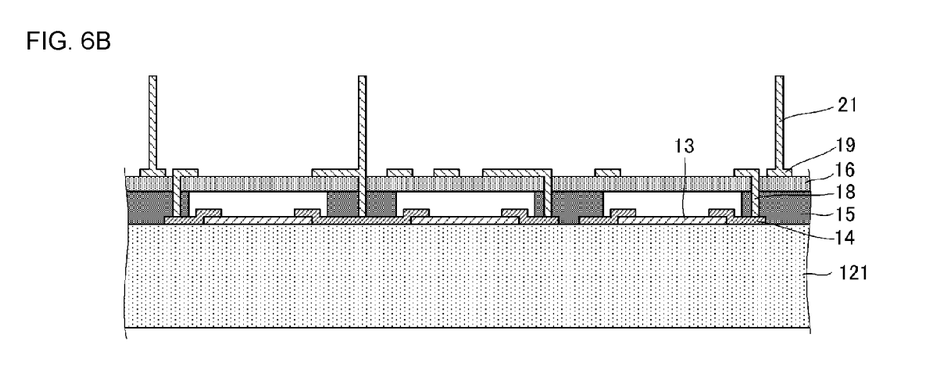

Subsequently, as illustrated in FIG. 6B, the columnar extended wiring lines (Cu posts) 21 are formed on the upper surface of the second wiring layer 19. The step of forming the extended wiring lines 21 is the same as the step of forming the extended wiring lines 18 and the second wiring layer 19, except that a resist of a thick film type is used.

Figure 6C:
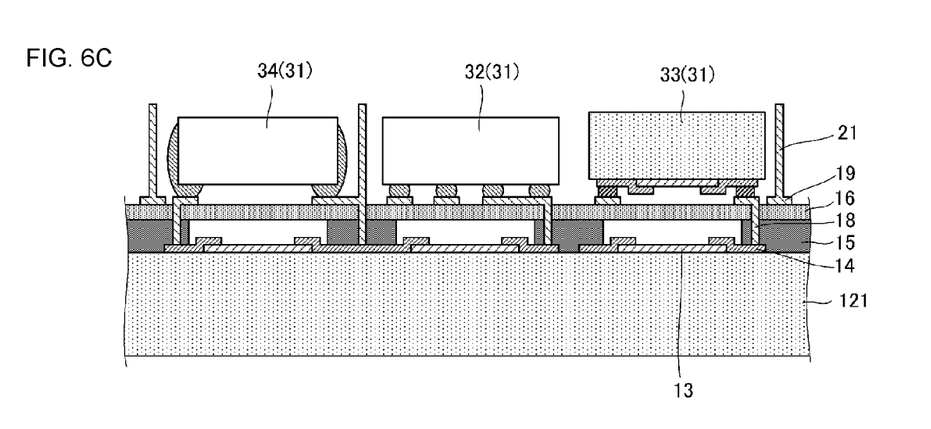

Subsequently, as illustrated in FIG. 6C, terminals (solder terminals) to mount the mounted electronic components 31 are temporarily fixed to the mounting pads of the second wiring layer 19 by thermal pressure bonding. Reflow soldering heating is performed in the reducing atmosphere at a temperature of 250° C., and the terminals for mounting the mounted electronic components 31 are bonded to the mounting pads of the second wiring layer 19. In this way, the RF switch 32, the elastic wave filter 33, and the chip inductor 34 are mounted on the mounting pads of the second wiring layer 19.

Figure 7A:
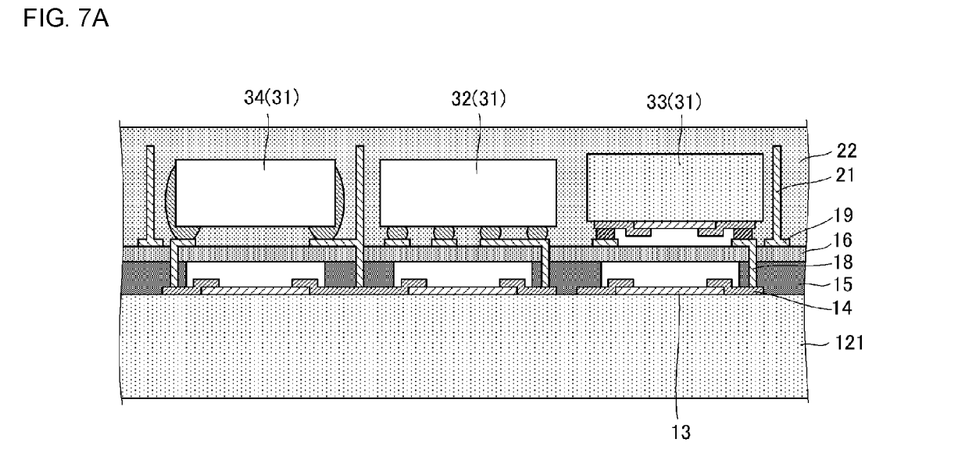
FIGS. 7A and 7B are schematic cross-sectional diagrams illustrating a method for manufacturing the front-end circuit component according to the first preferred embodiment of the present invention.

Subsequently, as illustrated in FIG. 7A, the resin layer 22 is formed so as to cover the mounted electronic components 31, the second wiring layer 19, and the extended wiring lines 21. At this time, the resin is controlled to prevent the resin from entering between the lower surface of the elastic wave filter 33 and the cover layer 16.

Figure 7B:
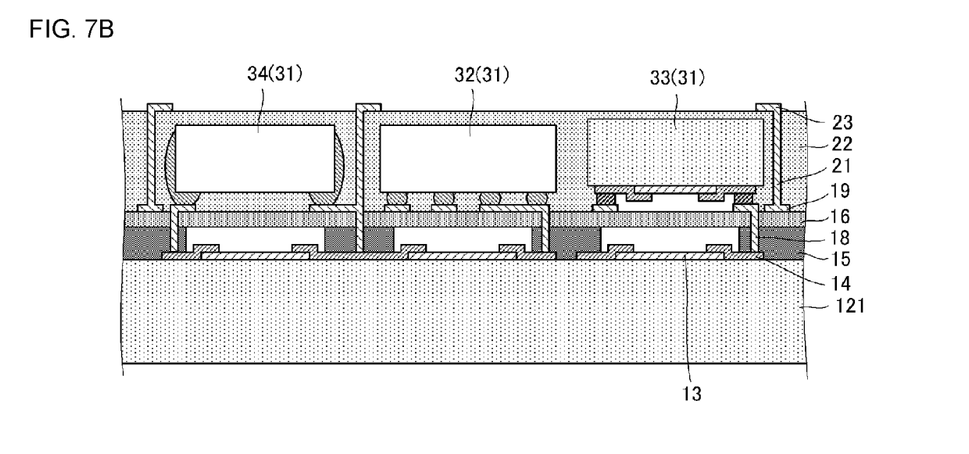

Subsequently, as illustrated in FIG. 7B, the resin layer 22 is polished from above, the upper end portion of each extended wiring line 21 is exposed from the upper surface of the resin layer 22. The offset wiring lines 23 are formed on the upper surface of the resin layer 22 by electrolytic plating in the same manner as in the step of forming the extended wiring lines 18 and the second wiring layer 19. Each offset wiring line 23 is connected to the upper end portion of a corresponding one of the extended wiring lines 21.

Figure 8A:
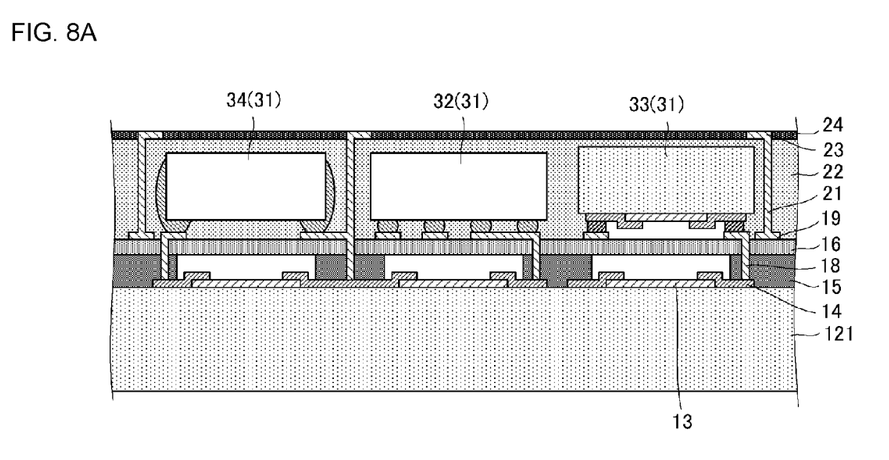
FIGS. 8A and 8B are schematic cross-sectional diagrams illustrating a method for manufacturing the front-end circuit component according to the first preferred embodiment of the present invention.

Subsequently, as illustrated in FIG. 8A, a photosensitive epoxy-based material is applied to the upper surface of the resin layer 22 by the spin coating method. Patterning is performed on the photosensitive epoxy-based material by the photolithography method in such a manner that the offset wiring lines 23 are exposed.

Figure 8B:
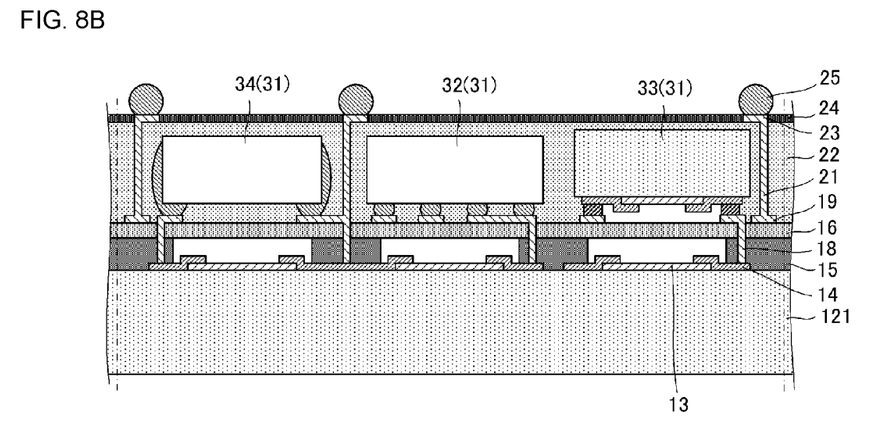

Subsequently, as illustrated in FIG. 8B, a solder paste is applied to each offset wiring line 23 with a metal mask used therefor. Reflow soldering heating and flux cleaning are performed, and the mounting terminals 25 are formed. Each mounting terminal 25 is connected to a corresponding one of the offset wiring lines 23. The piezoelectric wafer 121 is cut along a dashed line with a dicing machine, and the front-end circuit component 10 illustrated in FIG. 1 is completed.

Second Preferred Embodiment

Figure 9:
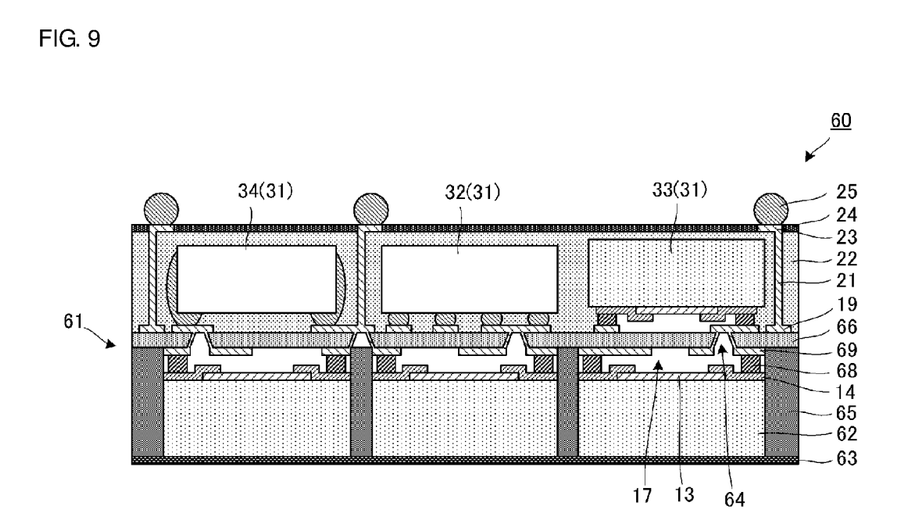
FIG. 9 is a schematic cross-sectional diagram of a front-end circuit component according to a second preferred embodiment of the present invention.

A front-end circuit component 60 according to a second preferred embodiment of the present invention will be described. FIG. 9 is a schematic cross-sectional diagram of the front-end circuit component 60. The front-end circuit component 60 includes a base-body elastic wave filter 61 instead of the base-body elastic wave filter 11 according to the first preferred embodiment. The base-body elastic wave filter 61 includes the IDT electrodes 13, the first wiring layers 14, piezoelectric substrates 62, a substrate 63, a supporting layer 65, a cover layer 66, solders 68, the second wiring layer 19, and second wiring layers 69.

A plurality of piezoelectric substrates 62 are provided on an upper surface of the substrate 63. Each IDT electrode 13 and each first wiring layer 14 are provided on an upper surface of a corresponding one of the piezoelectric substrates 62. The first wiring layer 14 is connected to a corresponding one of the IDT electrodes 13. A SiO$_2$ protection film (not illustrated) is provided on the surfaces of the IDT electrode 13 and the first wiring layer 14 such that a portion in contact with a corresponding one of the solders 68 is exposed. The supporting layer 65 preferably surrounds each piezoelectric substrate 62 and extends higher than the upper surface of the piezoelectric substrate 62. The cover layer 66 preferably extends over the IDT electrodes 13. In this way, the sealed spaces 17 are provided above the IDT electrodes 13.

The second wiring layer 19 is provided on the upper surface of the cover layer 66, and the second wiring layers 69 are provided on a lower surface of the cover layer 66. Vias 64 are provided in the cover layer 66. The second wiring layer 19 on the upper surface of the cover layer 66 is connected to each second wiring layer 69 on the lower surface of the cover layer 66 with a wiring line provided in a corresponding one of the vias 64 interposed therebetween. The first wiring layer 14 is connected to a corresponding one of the second wiring layers 69 on the lower surface of the cover layer 66 with the corresponding solder 68 interposed therebetween. The configuration other than this is the same as the configuration according to the first preferred embodiment.

Specifically, in the second preferred embodiment, the base-body elastic wave filter 61 includes a plurality of chips. In addition, the piezoelectric substrates 62 of the plurality of chips of the base-body elastic wave filter 61 may be made of different materials or may have different cut-angles. Further, not all of the plurality of chips need to be filter chips, and a chip such as a semiconductor device having another function such as a RF switch may also be mixed. Also in these cases, the same advantageous effects as those in the first preferred embodiment are achieved.

Note that the wiring layers are preferably provided on the upper and lower surfaces of the cover layer in the preferred embodiment described above, but the present invention is not limited thereto. In a preferred embodiment of the present invention, a wiring layer may be provided inside the cover layer.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component module comprising:
   an elastic wave filter including:
      a piezoelectric substrate;
      a functional electrode on an upper surface of the piezoelectric substrate;
      a supporting layer on the piezoelectric substrate and surrounding the functional electrode;
      a cover layer covering the functional electrode and defining a sealed space above the functional electrode, and being made of a resin film material;
      a first wiring layer provided on the upper surface of the cover layer;
      a second wiring layer that is provided on the piezoelectric substrate and is connected to the functional electrode; and
      an extended wiring line that is connected to the first wiring layer and the second wiring layer; and
   a mounted electronic component on the first wiring layer;
   wherein the cover layer is flexible.

2. The electronic component module according to claim 1, further comprising:
   a signal extraction wire line that is provided above the piezoelectric substrate and extends upwards; wherein
   an area where the mounted electronic component is mounted is smaller than an area of the upper surface of the piezoelectric substrate; and the signal extraction wire line is disposed outward from the mounted electronic component and is disposed inward of the upper surface of the piezoelectric substrate when viewed in a direction perpendicular to the piezoelectric substrate.

3. The electronic component module according to claim 1, further comprising:
a plurality of the elastic wave filters respectively having different pass bands; wherein
the mounted electronic component includes a radio frequency switch.

4. The electronic component module according to claim 1, wherein the elastic wave filter is a first elastic wave filter, and the mounted electronic component includes a second elastic wave filter.

5. The electronic component module according to claim 1, further comprising:
a plurality of the elastic wave filters;
a plurality of the mounted electronic components; and
a plurality of radio frequency filters each of which includes at least one of the plurality of the elastic wave filters or at least one of the plurality of the mounted electronic components; wherein
one of the plurality of mounted electronic components includes a radio frequency switch; and
the radio frequency switch is connected to the plurality of radio frequency filters with the first wiring layer interposed between the radio frequency switch and each of the plurality of radio frequency filters.

6. The electronic component module according to claim 5, wherein
the radio frequency switch includes a plurality of terminals and a common terminal; the
common terminal is connected to any one of the plurality of terminals; and
the common terminal is connected to an antenna, and each of the plurality of terminals is connected to a corresponding one of the plurality of radio frequency filters with the wiring layer interposed between the plurality of terminals and the corresponding plurality of radio frequency filters.

7. The electronic component module according to claim 1, wherein the mounted electronic component includes a multilayer substrate on which at least one of a capacitor and an inductor is provided.

8. The electronic component module according to claim 1, wherein the elastic wave filter is one of a surface acoustic wave filter and a plate wave filter.

9. The electronic component module according to claim 1, wherein the mounted electronic component is at least one of an RF switch, an elastic wave filter, a chip inductor, a chip capacitor, and an LC filter.

10. The electronic component module according to claim 1, wherein the functional electrode is an interdigital transducer.

11. The electronic component module according to claim 1, wherein the supporting layer is integral with the cover layer.

12. The electronic component module according to claim 11, further comprising vias provided in the supporting layer and in the cover layer, wherein the extended wiring line is in one of the vias.

13. The electronic component module according to claim 1, wherein the electronic component module is a front-end circuit component.

14. A wireless communication device comprising the electronic component module according to claim 1.

15. An electronic component module comprising:
a plurality of chips, at least some of the plurality of chips being a plurality of elastic wave filters respectively having different pass bands, and each of the plurality of the elastic wave filters including:
a piezoelectric substrate;
a functional electrode on an upper surface of the piezoelectric substrate;
a supporting layer surrounding the piezoelectric substrate and the functional electrode;
a cover layer covering the functional electrode and defining a sealed space above the functional electrode, and being made of a resin film material; and
a first wiring layer provided on the upper surface of the cover layer; and
a mounted electronic component on the first wiring layer.

16. The electronic component module according to claim 15, wherein at least one of the plurality of chips is not an elastic wave filter and is a chip having a function other than a function of the elastic wave filters, the chip including a semiconductor device.

* * * * *